US006927363B1

(12) United States Patent
Kao et al.

(10) Patent No.: US 6,927,363 B1
(45) Date of Patent: Aug. 9, 2005

(54) DISTRIBUTION MANIFOLD FOR EXHAUSTING PHOTORESIST VAPORS

(75) Inventors: Yao-Hwan Kao, Shin-Chu (TW); Hsun-Peng Lin, Miao-le (TW); Wen-Hwo Liu, Taipei (TW); Yuan-Ting Huang, Yi-Lan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 188 days.

(21) Appl. No.: 10/197,048

(22) Filed: Jul. 17, 2002

(51) Int. Cl.$^7$ .............................................. F27B 5/14
(52) U.S. Cl. ...................... 219/390; 219/405; 219/411; 392/416; 392/418; 118/724; 118/725; 118/50.1
(58) Field of Search .................................. 219/390, 405, 219/411; 118/724, 725, 728, 50.1, 720; 392/418

(56) References Cited

U.S. PATENT DOCUMENTS

| | | | |
|---|---|---|---|
| 6,185,370 B1 * | 2/2001 | Sekimoto et al. ........... | 392/386 |
| 6,228,171 B1 | 5/2001 | Shirakawa ................... | 118/666 |
| 6,229,116 B1 | 5/2001 | Shirakawa et al. ......... | 219/390 |
| 6,291,800 B1 * | 9/2001 | Shirakawa et al. ......... | 219/390 |
| 6,419,751 B1 * | 7/2002 | Nagashima ................. | 118/715 |

* cited by examiner

Primary Examiner—Shawntina Fuqua
(74) Attorney, Agent, or Firm—Duane Morris, LLP

(57) ABSTRACT

An exhaust apparatus for evacuating vapor during baking of liquid chemicals deposited on substrates including a heating chamber containing a hot plate for horizontally supporting and heating a substrate. A cover plate is suspended horizontally over the hot plate; the cover plate has a plurality of exhaust ports extending from the top to its bottom surfaces. The ports are radially and evenly disposed midway between the periphery and a centered port with a manifold mounted to the top of the cover plate. The manifold has tubular conduits connected underneath to each exhaust port. Each conduit has an adjustable damper disposed at its front opening for regulating the vapor being exhausted. The tubular conduits converge from each exhaust port towards a common enclosure with an exhaust pipe coupled to its top for exhausting vapor to an external recovery facility.

16 Claims, 8 Drawing Sheets

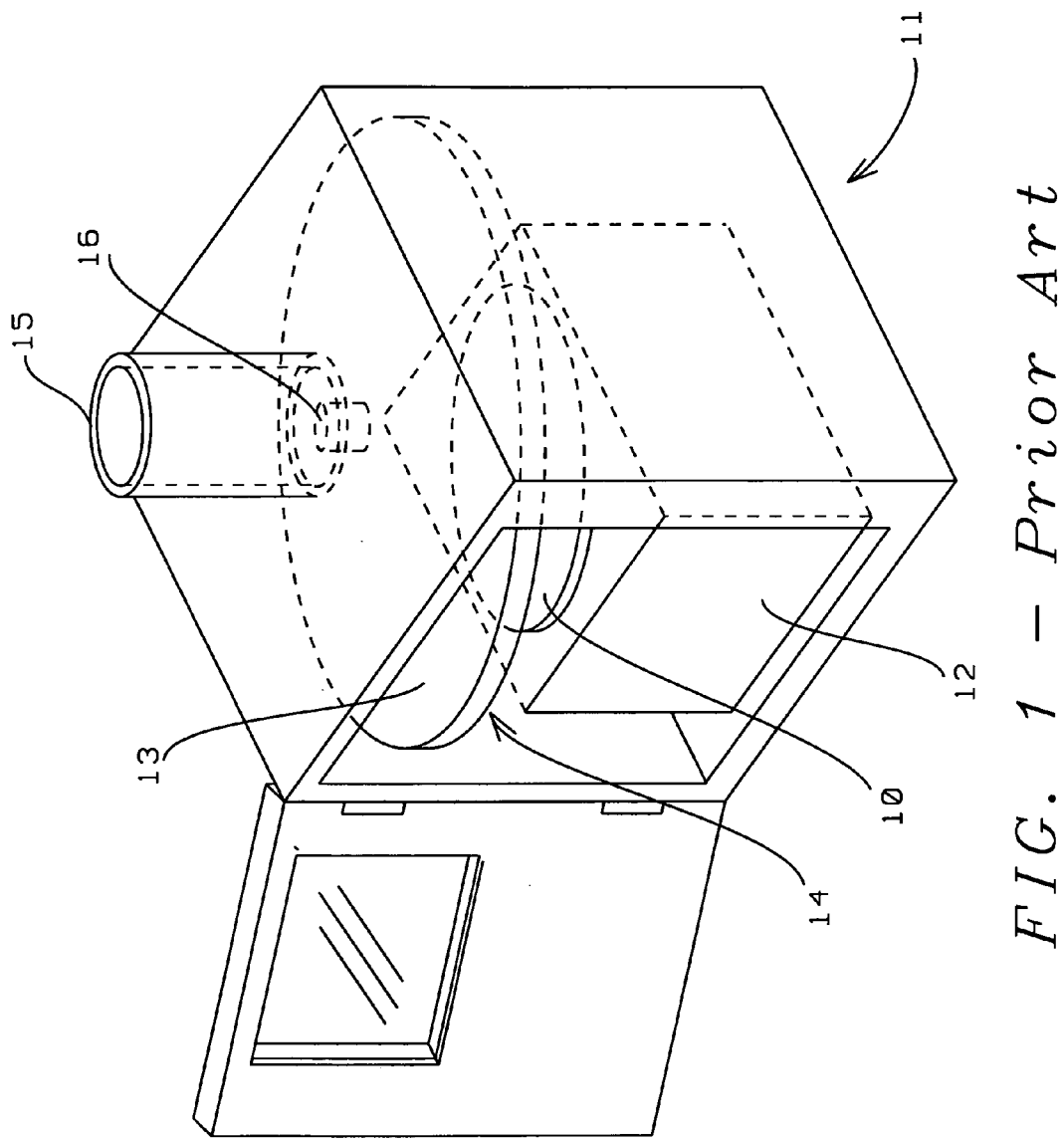
FIG. 1 – Prior Art

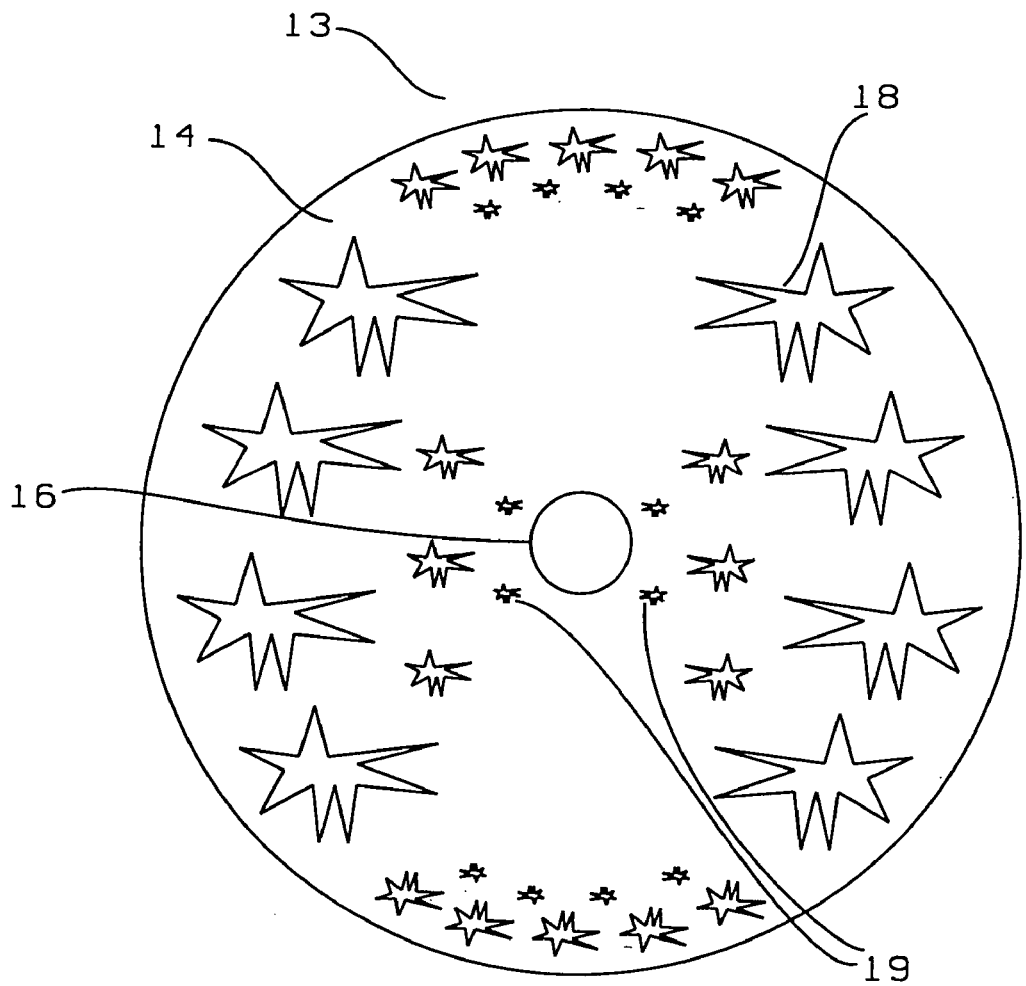
FIG. 2 — Prior Art

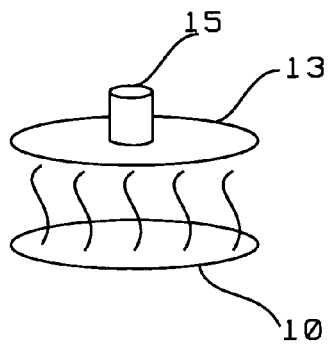
FIG. 3a –
Prior Art
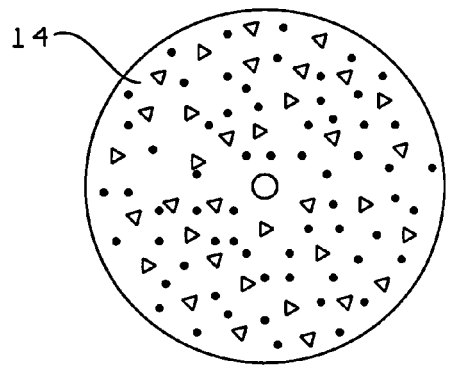
FIG. 3b –
Prior Art
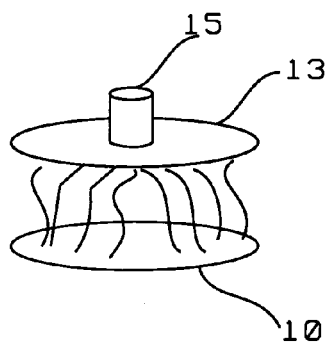
FIG. 4a –
Prior Art
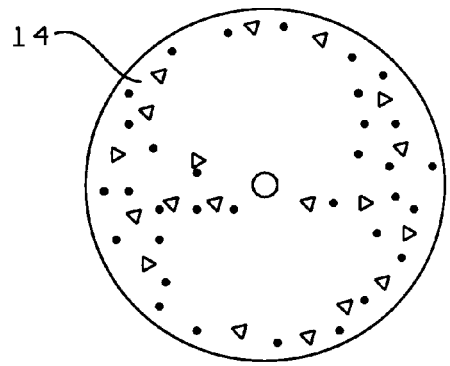
FIG. 4b –
Prior Art
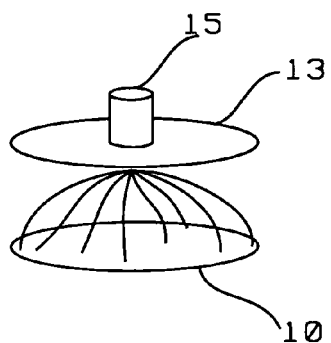
FIG. 5a –
Prior Art
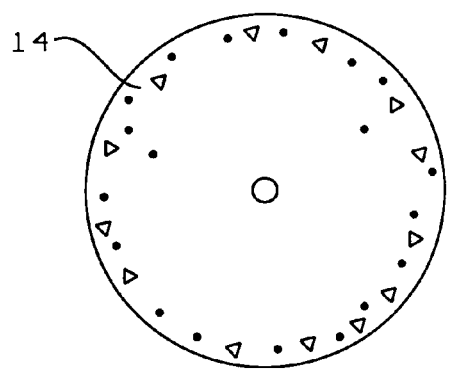
FIG. 5b –
Prior Art

DISTRIBUTION MANIFOLD FOR EXHAUSTING PHOTORESIST VAPORS

BACKGROUND OF THE INVENTION (1) Technical Field

This invention relates to methods for preventing particulate contamination on semiconductor substrates during photoresist baking and more particularly, to an apparatus for preventing condensed photoresist vapor from flaking off an exhaust plate during barrier and reflective coating bake (BARC).

(2) Description of the Prior Art

The following four documents relate to apparatus dealing with the processing of semiconductor substrates for forming integrated circuits. A thin film of material, for example, a photoresist that is suspended in a solvent, is applied to the surface of a semiconductor substrate. To harden the material, the thin film must be baked and then cooled.

U.S. Pat. No. 6,291,800B1 issued Sep. 18, 2001 to Shirakawa et al. discloses a hot plate and exhaust port design.

U.S. Pat. No. 6,229,116B1 issued May 8, 2001 to Shirakawa et al. shows a hot plate apparatus.

U.S. Pat. No. 6,228,171B1 May 8, 2001 to Shirakawa. and U.S. Pat. No. 6,185,370B1 relates to hot plate designs.

The use of a thin layer of photo resist on a wafer's surface in conjunction with photolithograhic masks provides the means to transfer various masking layers onto the substrate. The photolithographic mask selectively exposes a portion of photoresist film to actinic light while leaving the masked portion unexposed. The exposed portion makes the photoresist soluble in a base solution and insensitive to light. The unexposed portion is insoluble in the base solution and is photosensitive. The development of highly integrated circuit patterns with line widths and spacing in the sub micron ranges places increasingly higher demands on image resolution capabilities of the photoresist. Processes involving film thickness, thickness uniformity, resist baking, and intermediate handling have become critical steps in the manufacturing of high speed integrated circuits.

The focus of this invention is directed to a photoresist-baking chamber, and more particularly, to a modification of a plate cover such as that used over a deep temperature hot plate, manufactured by Tokyo Electric Ltd., Japan. This invention is concerned with the elimination of a source of contamination originating during baking of the photoresist. The baking procedure, namely pre-bake and post bake is done in conjunction with resist coating, exposing, and resist develop cycles. The heat energy is conventionally supplied with hot plates having a built-in resistance heater. During the baking process, the coated substrate rests on a plurality of short stand-off projections which creates a short space between the hot plate and substrate, thereby heating the substrate and baking the photoresist by the transference of heat by radiation, convection and conduction. The air and solvent vapor surrounding the hot plate is heated and rises up to a conically shaped plate and exhausted through an exhaust port located at its center. The centered port collects and evacuates most of the vapor, however, a dead zone of stagnated vapor condenses on the under side of the cover that eventually dries, flakes off, and falls causing particulate contamination to adhere to the substrate.

SUMMARY OF THE INVENTION

In the processing of semiconductor substrates for forming integrated circuits, a thin film of material, for example, a photoresist that is suspended in a solvent, is applied to the surface of the substrate. To harden the material, the thin film must be baked and then cooled. Traditionally, a hot plate with an exhaust means, within a chamber, is used for baking the resist at a relatively low temperature and exhausting only solvent vapors evaporating from the photoresist. The exhausting means is usually a shaped plate, with an exhaust port at its center, mounted over and within close proximity of the hot plate. Most photolithograhic processes utilize a hot plate as a heat source for baking photoresist, even those using elevated temperatures of about 250° C., e.g., a hard photoresist bake procedure for barrier and reflective coating. At this high temperature, photo resist will create crystal particles that disperse into suspension with the vapors being evacuated. Prior art exhausting means do not provide the proper exhaust flow pattern for high temperature baking.

Properly evacuating the vapors is extremely difficult and delicate using a single central exhaust port. If, for example the exhaust velocity is too low, a film of condensed vapor with inclusions of photoresist crystals will accumulate on the surface of the cover plate. After processing a number of substrates, the crystals will form aggregates that eventually fall on the substrate causing image defects. On the other hand, if the exhaust velocity is too high, the stream of a fast moving vapor will disturb the softened boundary layer of the photoresist by causing ripples on its surface, thereafter destroying photoresist uniformity.

Accordingly, the present invention provides an exhaust apparatus capable of appreciably reducing the cause of particulate contamination on the cover plate. The exhaust apparatus is provided with a plurality of exhaust ports that are distributed in a balanced evacuation pattern at the surface of the cover facing the substrate. Each port communicates to a distribution manifold having individually controlled dampers for channeling an adjusted rate of flow of vapor from each exhaust port, thereby balancing the flow gradient at the surface of the cover plate. This system eliminates "dead zones" that cause condensation of vapor and build-up of crystalliferous contaminants.

Therefore, a primary object of the present invention is to improve product yield by reducing substrate defects caused by particulate contamination falling from the cover plate during deep temperature baking of photoresist as experienced after barrier and reflective coating.

A second object of the present invention is to provide an exhaust apparatus for channeling the high temperature vapors through a plurality of individually controlled exhaust ports.

Another object of the present invention is to provide means for controlling exhaust velocity to each exhaust port thereby reducing stagnated vapor zones causing condensation of vapor, mixed with photoresist crystals, to build-up on the chamber cover.

A further object of the present invention is to reduce machine downtime caused by daily cleaning of particulate build-up on the chamber cover.

Yet another object of the present invention is to increase daily substrate throughput by reducing periodic maintenance and process monitor.

Additional objects of the invention will be set forth in the description, which follows, and in part will be obvious from the description.

BRIEF DESCRIPTION OF THE DRAWINGS

FIG. 1 illustrates a photoresist baking apparatus of the prior art.

FIG. 2 is a view showing contamination of a cover plate of the prior art.

FIGS. 3, 4 & 5 show vapor contamination relative to velocity, of the prior art.

DETAILED DESCRIPTION OF THE PREFERRED EMBODIMENT

Figure 6:
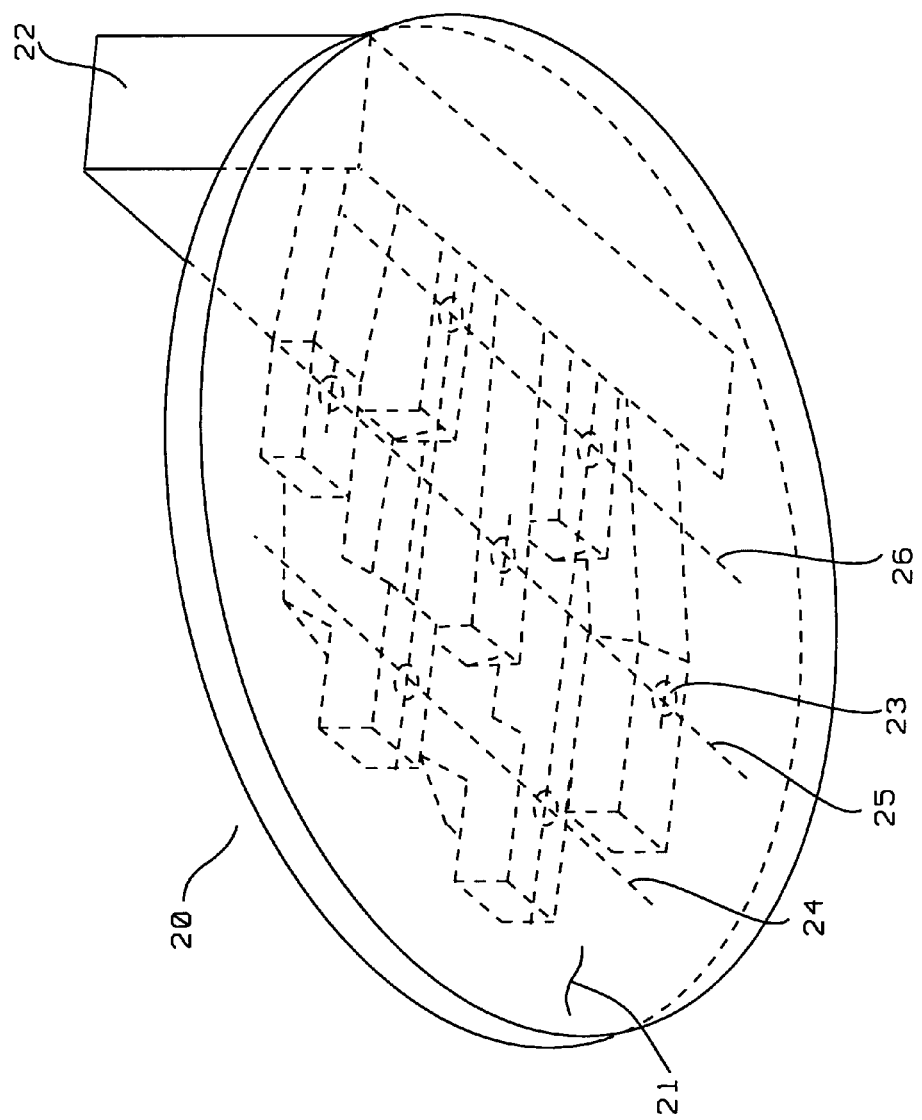
FIG. 6 is a perspective illustration of the bottom surface of a cover plate, of the invention, showing a plurality of exhaust ports.

This invention is concerned with improvements to high temperature baking of photoresist on semiconductor substrates using conventional equipment. A baking temperature of about 250° C. is required for a deep photoresist bake of barrier and reflective coating. The heat energy is supplied with hot plates having a built-in resistance heater. During the baking process, the coated substrate rests on a plurality of short, stand-off, projections creating a contiguous air space between the hot plate and substrate, thereby heating the substrate for deep baking the photoresist by the transference of heat by conduction. The solvent driven from the photoresist, along with the heated air surrounding the hot plate is exhausted through an exhaust port located at the center of a cover plate positioned above the substrate. However, at elevated temperatures, photoresist releases crystalliferous particles. These particles become airborne by the solvent vapors being evacuated through a centrally positioned exhaust port on a cover plate above the substrate. The centered exhaust port collects and evacuates most of the vapor, however, a zone of stagnated vapor condenses on the under side of the cover leaving a dry film that accumulates, flakes off and adheres to the substrate eventually causing an image defect.

The present invention provides an exhaust apparatus capable of appreciably reducing the accumulated contamination on the under surface of the cover plate. The exhaust apparatus is provided with a plurality of exhaust ports that are distributed in a balanced evacuation pattern at the surface of the cover facing the substrate. Each port communicates with a distribution manifold having individually controlled dampers for channeling an adjusted rate of vapor flow exiting each exhaust port, thereby balancing the flow volume at the surface of the cover plate. This control system eliminates the static zones, which cause build-of vapor and crystalliferous particulates.

Referring now to FIGS. 1 through 5, illustrating conventional photoresist baking apparatus and the major problems associated with high temperature baking. FIG. 1 shows a conventional arrangement of a baking chamber 11 having a hot plate 12 with a heated surface for contiguously supporting substrate 10. A cover plate 13 with a top and bottom surface and periphery. The bottom surface 14, is positioned proximate the upper surface of the substrate 10. A centered exhaust port 16 extends from the bottom surface 14 through to the top surface, connects to a partially shown external exhaust stack 15. The above baking arrangement is traditionally employed with low-temperature baking of photoresist.

A baking temperature of about 250° C. is required for deep photoresist baking of barrier and reflective coating. Heat energy is supplied by the same temperature controlled hot plate 12 which has a built-in resistance heater (not shown). Solvent is driven from the photoresist and exhausted through the exhaust port 16. The problem occurs at elevated temperatures. Photoresist releases crystalliferous particles at the higher temperatures. These particles become airborne and carried with the solvent vapors through the exhaust port on the cover plate above the substrate. The centered exhaust port 16 collects and evacuates most of the vapor, however, a zone of stagnated vapor condenses on the underside of the cover leaving a dry film that accumulates, amalgamates, flakes off and adheres to the substrate eventually causing an image defect. FIG. 2 schematically illustrates the bottom surface 14 of a cover plate 13 with a single exhaust port 16. A typical pattern of amalgamated crystals is illustrated with a deep baking temperature of about 250° C. using a conventional baking chamber. The larger particulates 18 tend to accumulate more towards the periphery of the cover while the smaller particulates 19 accumulate closer to the center port.

FIGS. 3, 4 and 5 illustrate the effects of exhaust flow studies performed on equipment of the prior art. In each analysis, a substrate 10 with a photoresist deposited on its surface is heated to a deep baking temperature of about 250° C. In all of the illustrations, the heated substrate 10 show a distinct vapor dynamic relative to a single exhaust port having an adjusted exhaust speed of between 0 m/s to 18.5 m/s. The flow studies show relative amounts of contamination depositing on surface 14 of the cover plate 13 with a single exhaust port connecting with exhaust pipe 15.

FIG. 3 shows the effects of processing fifty coated substrates 10 at a zero exhaust rate. The undersurface 14 of cover 13 is totally contaminated. This becomes patently obvious by the uniform field of rising vapors shown in the illustration. FIG. 4 shows the effects after processing two hundred coated substrates with an exhaust rate of 10.3 m/s. The contamination is distributed predominately at the periphery of the chamber cover. This implies a weak exhaust flow caused by the position of the exhaust tube being parallel with the cover and affects a disordered wind flow, which distributes the crystalliferous particulates in a fan like pattern. FIG. 5 shows the effects after processing two hundred coated substrates with an exhaust rate of 18.5 m/s. The under surface 14 of the cover 13 is clear except for an annular band close to the periphery. Although a negligible amount of contamination occurs, the exhaust rate alters the surface uniformity of the fluid resist causing ripples on its surface.

Figure 7:
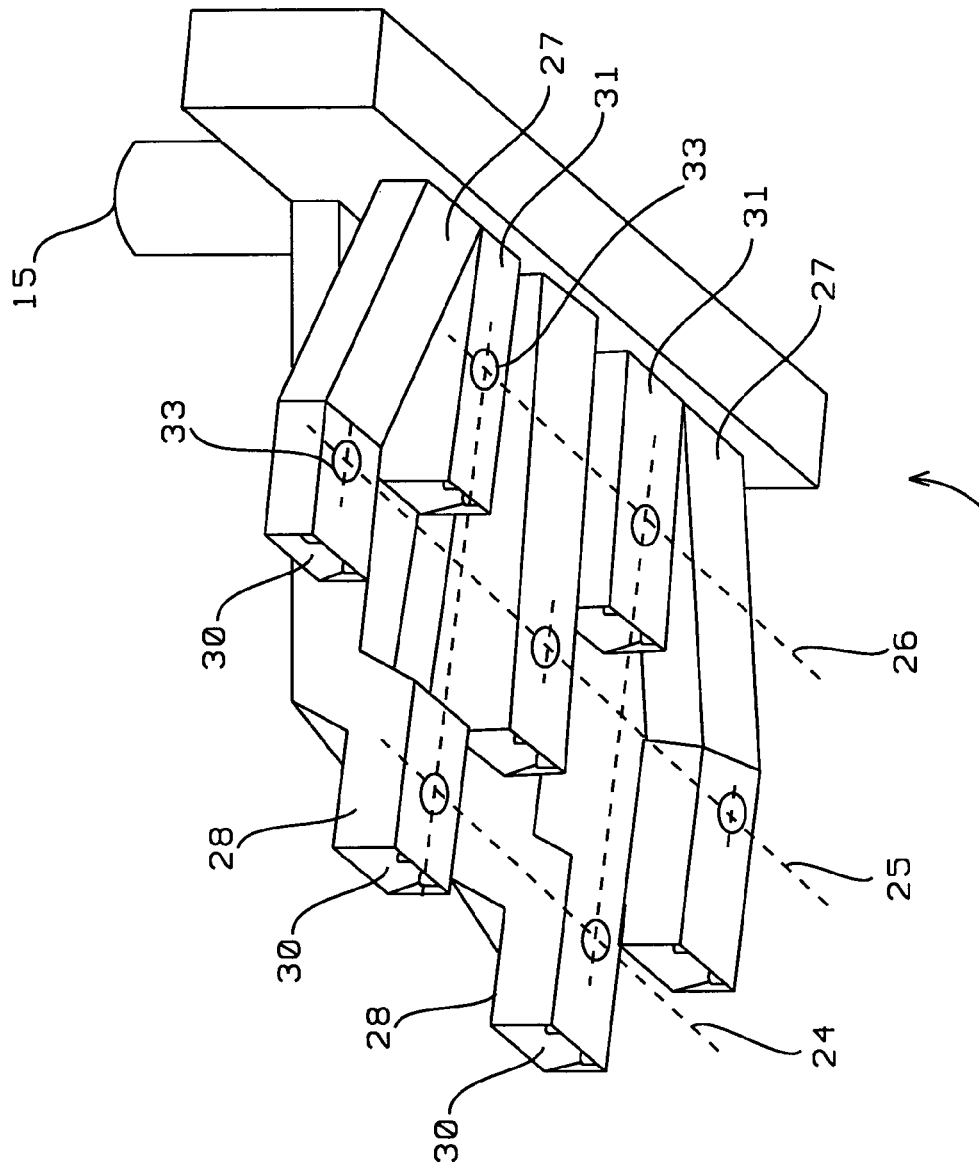
FIG. 7 is a perspective illustration of a bottom view of a distribution manifold of the invention.
Figure 8:
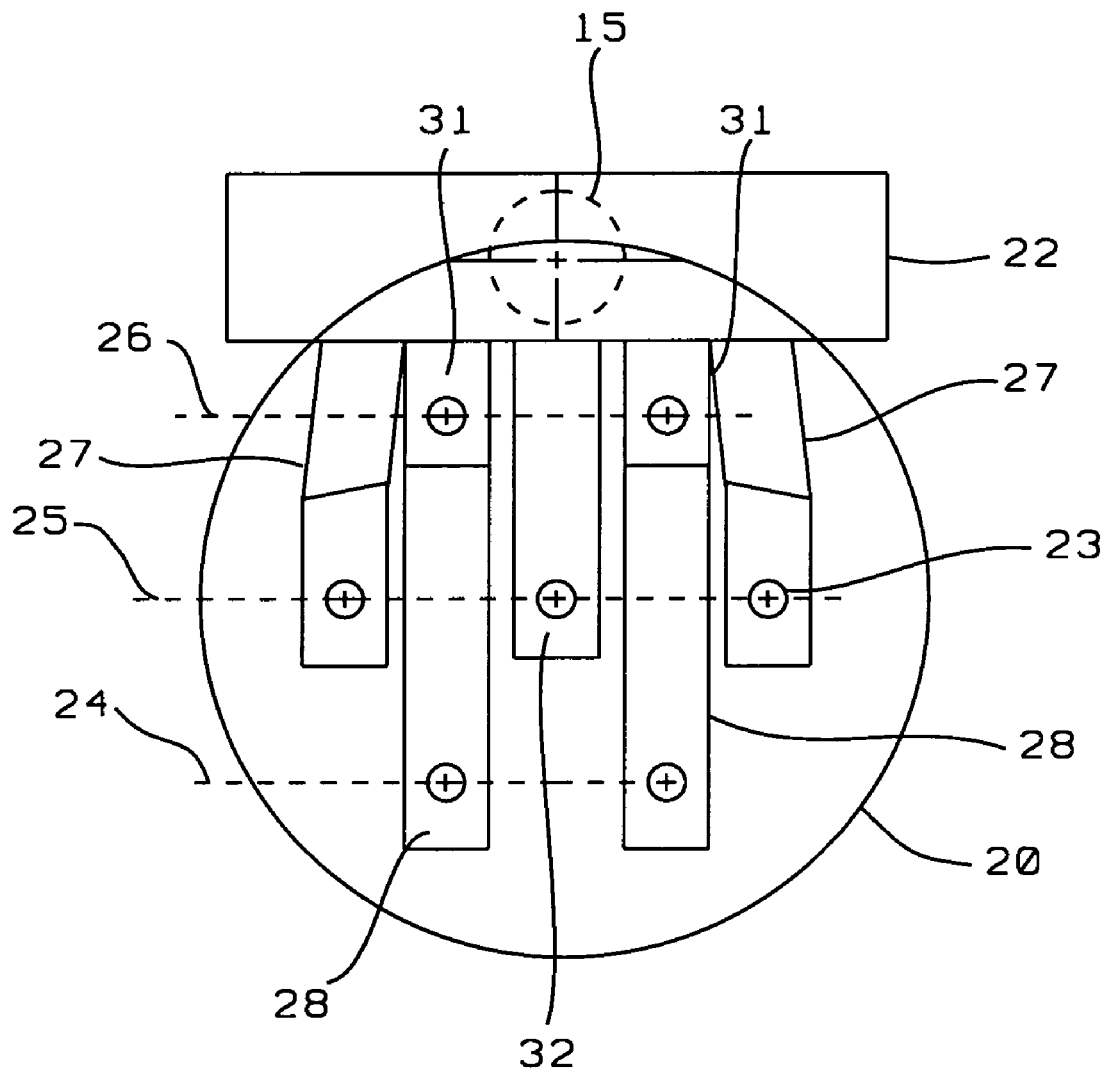
FIG. 8 is a bottom view of the cover plate showing an integrated distribution manifold of the invention.
Figure 9:
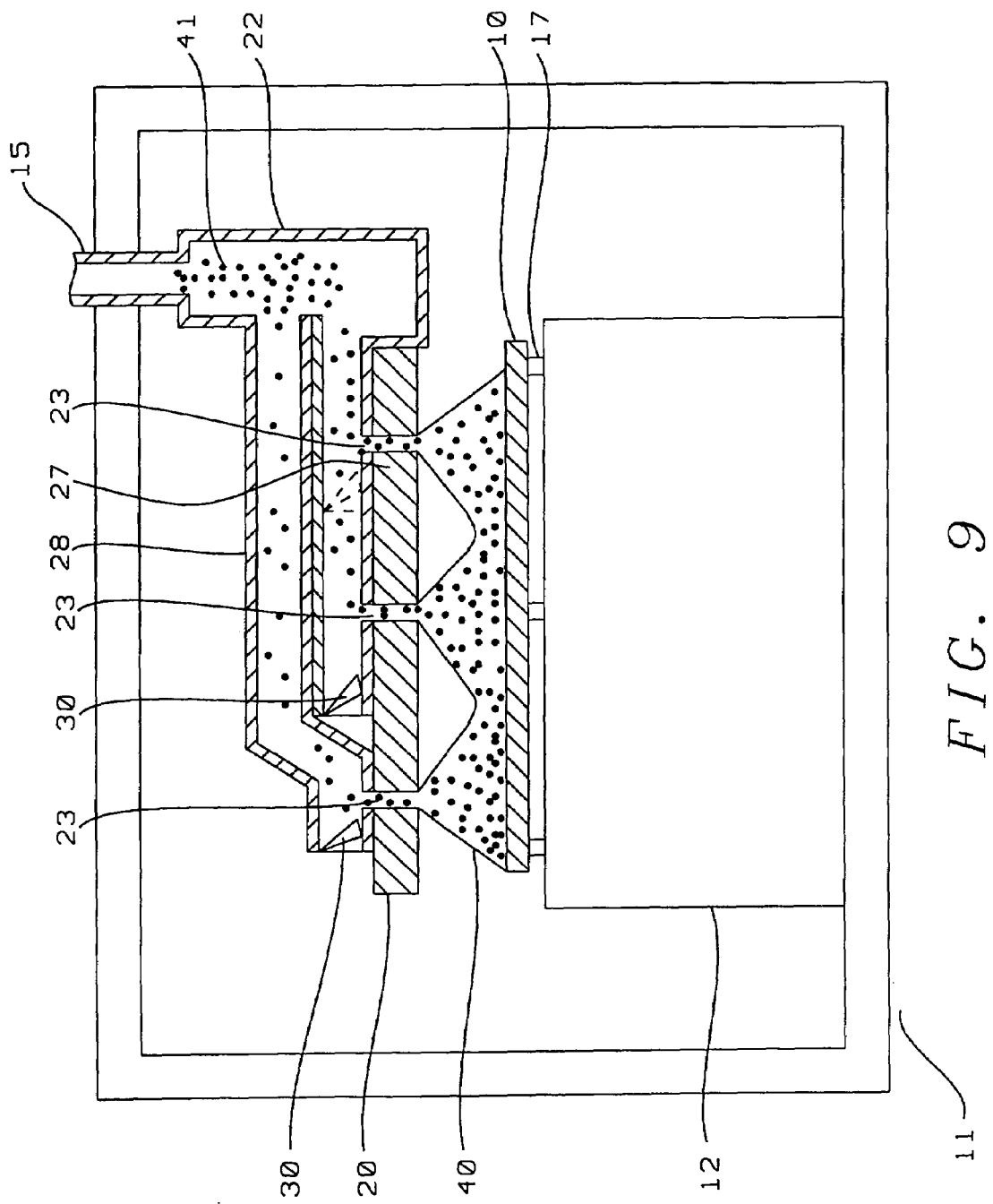
FIG. 9 is a sectional view of the distribution manifold showing the exhaust performance of the invention.

FIGS. 6 through 9 illustrate various views of an exhaust apparatus of the invention, showing a preferred application to exhaust vapor during deep temperature baking of a photoresist on substrates. FIG. 9 shows a side view of a heating chamber 11 containing a hot plate 12 for horizontally supporting and heating a single substrate 10. The substrate rests on a plurality of short pins 17 permitting conductive heat transfer for baking. A cover plate 20 is mounted horizontally within close proximity to the substrate. The cover plate 20 has a top surface, a bottom surface 21, and periphery. A plurality of exhaust ports 23 is provided. The exhaust ports 23 extend from the top through to the bottom surface of the cover plate 20. The layout of the exhaust ports 23 (best illustrated in FIG. 8) are radially and evenly disposed midway between the periphery and a port placed on center of the cover plate. A manifold structure 22 is horizontally mounted to the top surface of the cover plate 20. The manifold has a plurality of tubular conduits configured in two tier sets 27 and 28 for interconnecting with each of the exhaust ports. The conduits egress from a common enclosure located at a far end of the manifold and branch to each exhaust port position. An exhaust pipe 15 couples to the top of the common enclosure for exhausting the vapor/crystalliferous mix 41 to external traps (not shown).

Each of the conduit members belonging to sets 27 and 28 have an adjustable damper disposed at frontward openings at each of the tubular conduits 27 and 28. Each damper has an adjustable pivoting gate 30 to regulate the projected area of the frontward openings for balancing and controlling turbulent patterns caused by the vapor volume being drawn through the plurality of exhaust ports. This can be simply illustrated by the envelope 40 that diagrammatically shows the containment of the vapor/crystalliferous mix 41.

FIG. 6 shows a bottom surface 21 perspective of the cover plate 20 displaying the plurality of exhaust ports 23 patterned on center lines 24, 25, and 26. The manifold structure 22 is shown in a predominately-hidden view hole.

FIG. 7 illustrates the manifold structure 22 in a bottom perspective view, displaying the plurality of exhaust inlets 33 patterned on center lines 24, 25, and 26 that are disposed to correspond to the locations of the exhaust ports of the cover plate. The manifold has a plurality of tubular conduits configured in two tier sets 27 and 28 for interconnecting with each of the exhaust ports. The conduits egress from a common enclosure located at a far end of the manifold and branch to each exhaust port position. An exhaust pipe 15 couples to the top of the common enclosure for exhausting the vapor/crystalliferous mix 41 to external traps (not shown). Each of the conduit members belonging to sets 27 and 28 have an adjustable damper disposed at frontward openings at each of the tubular conduits 27 and 28. Each damper has an adjustable pivoting gate 30.

What is claimed is:

1. An exhaust apparatus for evacuating vapor during baking of liquid chemicals deposited on substrates, comprising:
    a heating chamber containing a hot plate for horizontally supporting and heating a substrate;
    a cover plate suspended horizontally over said hot plate;
    said cover plate having a top surface, a bottom surface, and periphery;
    said cover plate having a plurality of exhaust ports extending from said top to said bottom surfaces, said plurality of exhaust ports are positioned to effectively prevent amalgamation of crystals on said bottom surface of said cover plate;
    a manifold structure horizontally mounted to the top surface of said cover plate, said manifold structure having conduits connecting each exhaust port to a common enclosure, said manifold structure further comprising:
    adjustable dampers disposed at frontward openings of said conduits, said dampers having adjustable pivoting gates for controlling vapor flow through each exhaust port to said common enclosure; and
    an exhaust pipe coupled to a top of said common enclosure for exhausting vapor to external recovery means.

2. The apparatus according to claim 1 wherein said liquid chemicals are selected from a group consisting of high temperature and low temperature photoresists.

3. The apparatus according to claim 1 wherein said plurality of exhaust ports, equally disposed on said cover plate, effectively remove vapors including impurities produced by a deep temperature of about 250° C. during the baking of barrier and reflective coatings, said impurities include photoresist crystals mixed with solvent vapors.

4. The apparatus according to claim 1 wherein said plurality of exhaust ports, equally disposed on said cover plate, effectively remove vapors produced by lower temperature resists.

5. The apparatus according to claim 1 wherein preventing amalgamation of crystals on said bottom surface of said cover plate, prevents a source of particulate contamination from falling on said substrate.

6. The apparatus according to claim 1 wherein said plurality of exhaust ports equally disposed on said cover plate reduces daily downtime required for cleaning of said cover plate.

7. The apparatus according to claim 1 wherein said plurality of exhaust ports, equally disposed on said cover plate helps to increase product yield by reducing product defects caused by particulate contaminants.

8. An exhaust apparatus for evacuating vapor during baking of liquid chemicals deposited on substrates, comprising:
    a heating chamber containing a hot plate for horizontally supporting and heating a substrate;
    a cover plate suspended horizontally over said hot plate, said cover plate having a top surface, a bottom surface, and periphery;
    said cover plate having a plurality of exhaust ports extending from said top to said bottom surfaces, said plurality of exhaust ports are positioned to effectively prevent amalgamation of crystals on said bottom surface of said cover plate;
    a manifold structure vertically mounted to the top surface of said cover plate, said manifold structure having conduits connecting each exhaust port to a common enclosure, said manifold structure further comprising:
    adjustable dampers disposed at frontward openings of said conduits, said dampers having adjustable pivoting gates for controlling vapor flow through each exhaust port to said common enclosure; and
    an exhaust pipe coupled to a top of said common enclosure for exhausting vapor to external recovery means.

9. The apparatus according to claim 8 wherein said liquid chemicals are selected from a group consisting of high temperature and low temperature photoresists.

10. The apparatus according to claim 8 wherein said plurality of exhaust ports, equally disposed on said cover plate, effectively remove vapors including impurities produced at temperatures of about 250° C., said impurities include photoresist crystals mixed with solvent vapors.

11. The apparatus according to claim 8 wherein said plurality of exhaust ports, equally disposed on said cover plate, effectively remove vapors produced by lower temperature resists.

12. The apparatus according to claim 8 wherein preventing amalgamation of crystals on said bottom surface of said cover plate, prevents a source of particulate contamination from falling on said substrate.

13. The apparatus according to claim 8 wherein said plurality of exhaust ports equally disposed on said cover plate reduces daily downtime required for cleaning of said cover plate.

14. The apparatus according to claim 8 wherein said plurality of exhaust ports, equally disposed on said cover plate helps to increase product yield by reducing product defects caused by particulate contaminants.

15. The apparatus according to claim 1 wherein said manifold structure has tubular conduits, each connected to an exhaust port, said tubular conduits branch from said exhaust ports towards a common enclosure.

16. The apparatus according to claim 8 wherein said manifold structure has tubular conduits, each connected to an exhaust port, said tubular conduits branch from said exhaust ports towards a common enclosure.

* * * * *

UNITED STATES PATENT AND TRADEMARK OFFICE
CERTIFICATE OF CORRECTION

PATENT NO. : 6,927,363 B1
DATED : August 9, 2005
INVENTOR(S) : Yao-Hwan Kao et al.

It is certified that error appears in the above-identified patent and that said Letters Patent is hereby corrected as shown below:

Column 5,
Line 38, insert:
-- In Fig. 8, the illustration gives visual clarity to the prior perspectives by showing a direct bottom view of the cover plate 20 without any visual distortions that may be evident in some of the prior Figs. of the invention.

Figure 10:
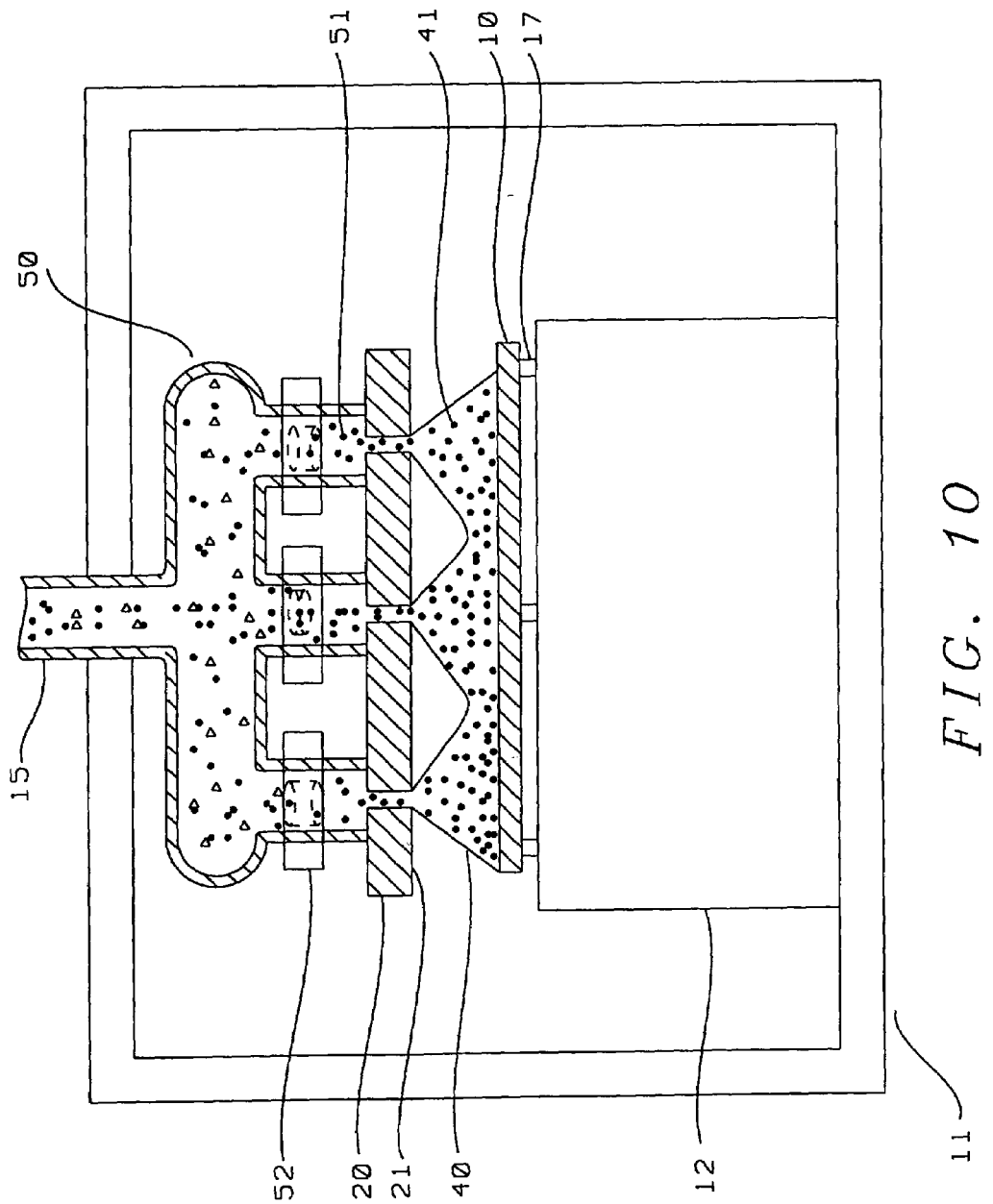
FIG. 10 is a side view of another embodiment of a vertical distribution manifold of the invention.

Fig. 10 shows a second embodiment of the invention. Exhaust manifold 50 has a plurality of tubular conduits 51 vertically disposed and matching a plurality of exhaust ports included in cover plate 20. An exhaust pipe 15 extends upward from the top of chamber 11 communicating with external traps (not shown). Each tubular conduit has an adjustable damper disposed inline. Each damper has a rotatable spool 52 for regulating turbulent patterns generated by the vapors drawn through the exhaust ports. This is illustrated within the envelope 40 diagrammatically showing containment of the vapor/ crystalliferous mix 41 from the substrate 10 to the bottom surface 21 of the cover plate.

While the invention has been particularly shown and described with reference to the preferred embodiments thereof, it will be understood by those skilled in the art that various changes in form and details may be made without departing from the spirit and scope of the invention. --.

Signed and Sealed this

Sixteenth Day of May, 2006

JON W. DUDAS
*Director of the United States Patent and Trademark Office*